US00RE36772E

United States Patent [19]

Vranish et al.

[11] E Patent Number: Re. 36,772

[45] Reissued Date of Patent: Jul. 11, 2000

[54] DRIVEN SHIELDING CAPACITIVE PROXIMITY SENSOR

[75] Inventors: John M. Vranish, Crofton, Md.; Robert L. McConnell, Independence, W. Va.

[73] Assignee: The United States of America as represented by the Administrator of the National Aeronautics and Space Administration, Washington, D.C.

[21] Appl. No.: 08/999,976

[22] Filed: Nov. 6, 1996

Related U.S. Patent Documents

Reissue of:

[64] Patent No.: 5,166,679
Issued: Nov. 24, 1992
Appl. No.: 08/710,845
Filed: Jun. 6, 1991

U.S. Applications:

[63] Continuation of application No. 08/031,247, Mar. 11, 1993, abandoned.

[51] Int. Cl.[7] ..... G08C 19/10

[52] U.S. Cl. ..... 340/870.37; 340/562; 324/687

[56] References Cited

U.S. PATENT DOCUMENTS

| | | | |
|---|---|---|---|
| 3,896,425 | 7/1975 | Erichsen | 340/563 |
| 4,661,797 | 4/1987 | Schmall | 324/661 |
| 4,914,421 | 4/1990 | d'Alayer de Costemore d'Arc et al. | 324/690 |

OTHER PUBLICATIONS

"Tactile Sensors for Robotics and Medicine", John G. Webster, John Wiley & Sons, Inc., 1988, pp. 198–207.

"An In–Situ Evaluation of a Capacitive Sensor–Based Safety System for Automated Manufacturing Environments", Robots 13, Conference Proceedings, SME/RI, May 7–11, 1989, pp. 7–13 thru 7–25.

*Primary Examiner*—Michael Horabik
*Assistant Examiner*—Timothy Edwards, Jr.
*Attorney, Agent, or Firm*—Keith L. Dixon

[57] ABSTRACT

A capacitive proximity sensing element, backed by a reflector driven at the same voltage as and in phase with the sensor, is used to reflect the field lines away from a grounded robot arm towards an intruding object, thus dramatically increasing the sensor's range and sensitivity.

8 Claims, 1 Drawing Sheet

DRIVEN SHIELDING CAPACITIVE PROXIMITY SENSOR

Matter enclosed in heavy brackets [ ] appears in the original patent but forms no part of this reissue specification; matter printed in italics indicates the additions made by reissue.

*This application is a continuation of application Ser. No. 08/031,247, filed Mar. 11, 1993 now abandoned, which is a Reissue of application Ser. No. 07/710,845 filed Jun. 6, 1991 now U.S. Pat. No. 5,166,679.*

ORIGIN OF THE INVENTION

This invention was made by employees of the U.S. Government and accordingly may be manufactured and used by or for the Government for governmental purposes without the payment of any royalties thereon or therefor.

FIELD OF THE INVENTION

The present invention relates generally to proximity sensor apparatus and more particularly to a safety sensor in which a machine such as a robot senses the proximity to objects including humans at a range sufficient to prevent collisions.

BACKGROUND OF THE INVENTION

Capacitive sensors used for proximity sensing are generally known; however, such sensors do not adequately control stray capacitance and consequently do not perform with an adequate range and sensitivity for many applications. To overcome these limitations, the sensors are often mounted at substantial distances from the machinery, thus reducing their effectiveness.

The purpose of the present invention is to provide a proximity sensor for a robot arm that will sense intruding objects so that the robot controller can prevent the robot from colliding with objects in space, particularly a human being. This sensor must be able to function reliably in the extreme environment of outer space and operates so as not to disturb or be disturbed by neighboring instruments. It must be simple, compact and incidental to the robot design and be able to detect objects at ranges in excess of 12 inches so that the robot has sufficient time to react. In the past a capacitive sensor typically was mounted in a stand-off relationship from the grounded robot arm a considerable distance, typically 1 in. from the outer surface of the arm. This tends not only to disfigure the robot arm, but causes it to be bulkier than necessary. It also makes cross talk between the sensor elements more pronounced and tends to impede the flow of heat from the robot arm to outer space.

Although the driven shield technique is also known in conjunction with capacitive sensors to prevent stray capacitance in lead wires and to increase input impedance, it has also been utilized in connection with tactile sensors where pressure is exerted against one or both plates of a capacitor.

SUMMARY

It is an object of the present invention, therefore, to provide an improvement in capacitive sensors.

It is a further object of the invention to provide an improvement in capacitive proximity sensors which significantly increase their range and sensitivity.

It is still another object of the invention to provide an improved capacitive sensor for proximity sensing insofar as it relates to a robot's ability to prevent collisions with objects coming into relatively close proximity thereto.

Briefly, the foregoing and other objects are achieved by a robotic arm proximity sensing skin which includes a capacitive sensing element, backed by a reflector driven at the same voltage as and in phase with the sensing element. The reflector is used to reflect the electric field lines of the sensor capacitor away from the grounded robot arm towards an intruding object. The sensor comprises a first thin sheet of conductive material driven by an electronic circuit and forms one electrode of a capacitor, the second electrode of which is provided by the intruding object and other nearby objects. A second thin sheet of conductive material considerably wider than the sheet forming the sensor is inserted between the sensor and the grounded arm of the robot. The sensor is thus shielded from the nearby ground such that the capacitance between it and the ground is substantially reduced, if not eliminated. The shield is driven through a voltage follower circuit by the same signal that is coupled to an oscillator circuit whose output is inversely proportional to the capacitance of the sensor.

BRIEF DESCRIPTION OF THE DRAWINGS

The following detailed description of the invention will be more readily understood when considered together with the [accompany] *accompanying* drawings in which.

DETAILED DESCRIPTION OF THE INVENTION

Figure 1:
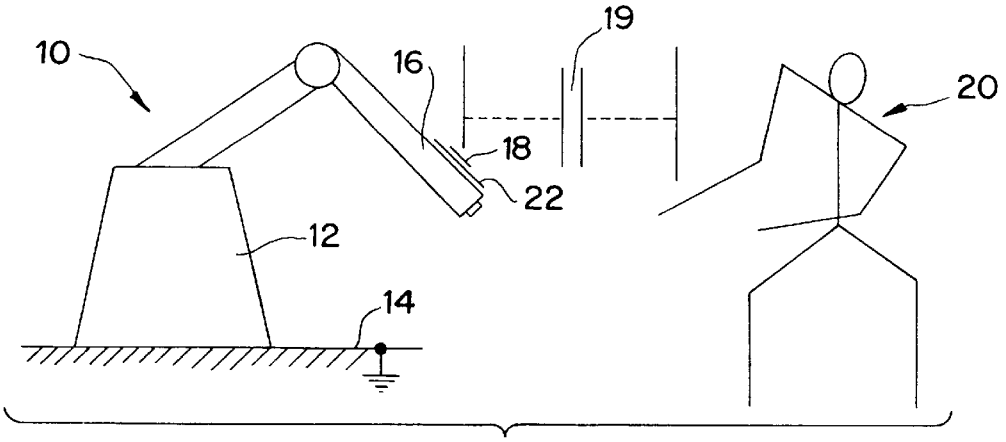
FIG. 1 is a diagram generally illustrative of the present invention.

Referring now to the drawings and more particularly to FIG. 1, reference numeral 10 denotes a robot having a base 12 which is shown being grounded via a support surface 14 and having an articulated arm structure 16 including a capacitive type proximity sensor 18 which is used to sense the presence of objects 20, such as human beings, which come into close proximity so that the robot can take appropriate measures to avoid collision with the object. This type of proximity sensing is essential not only in industry, but one very important use of this type of apparatus is to prevent a robot operating in space from colliding with a human being working in conjunction with or separate from the robot. The diagram of FIG. 1 also discloses an element 22 beneath *and spaced apart in substantially overlapping parallel fashion from* the sensor 18 and will be considered subsequently since it goes to the heart of this invention.

Figure 2A:
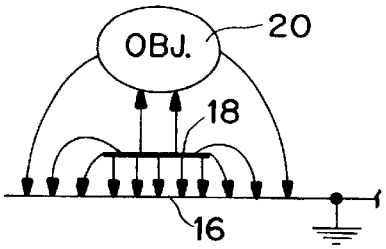
FIG. 2A PRIOR ART
FIG. 2A is a diagram illustrative of the electrical field associated with a proximity sensor in accordance with known prior art.

Typical prior art proximity sensing of an object 20 is known to involve the *use* of a capacitive sensor 18 which is mounted externally of the robot arm 16 as shown in FIG. 2A. The stand-off distance for example, is in the order of 1 in. The electric field associated with this type of proximity sensor is furthermore shown by the arrows emanating from the sensor 18 to ground via the skin of the robot arm 16 as well as back to the object 20 being sensed. Also, there is an electric field from the object 20 to the grounded arm 16. Such a configuration has resulted in a sensitivity which is unacceptable for space robotic applications where detection ranges in excess of 1 foot is required so that the robot 10, for example, can be deactivated or commanded to take some type of evasive action in order to prevent a collision with the object 20.

The sensor 18 is essentially a thin sheet of conductive material driven by an electronic circuit and acts as one electrode of a capacitor 19, with the second electrode being provided by the intruding object 20 as shown in FIG. 1, for example. The capacitor 19 controls the frequency of an oscillator, not shown, so that when an object for some reason or another intrudes, the output frequency of the oscillator changes. The grounded objects in the vicinity of the conductor sheet 18 and the lead wires, not shown, between the circuit and the sheet 18 create a large fixed parasitic capacitance which reduces sensor sensitivity to the intruding object 20.

To increase the sensitivity of the proximity sensor by reducing the parasitic capacitance exhibited by the electric field shown in FIG. 2A, the present invention provides for the insertion of a second relatively thin sheet 22 of conductive material, which is substantially wider than the sensor 18, *spaced apart in substantially overlapping parallel fashion* between the sensor 18 and the grounded robot arm 16. This generates an electric field distribution as shown in FIG. 2B where it can be seen that the member 22 acts as a shield for the capacitive sensor 18 wherein the field concentration is centered between it and the object 20, with little, if any, of the field returning directly to ground.

In operation, the shield member 22 is driven at the same instantaneous voltage as the capacitive sensor 18, but is not frequency sensitive to nearby objects as is the sensor. Thus the sensor 18 is shielded from nearby ground, i.e. the robot arm 16, such that the capacitance between it and the arm is substantially reduced if not eliminated.

Figure 2B:
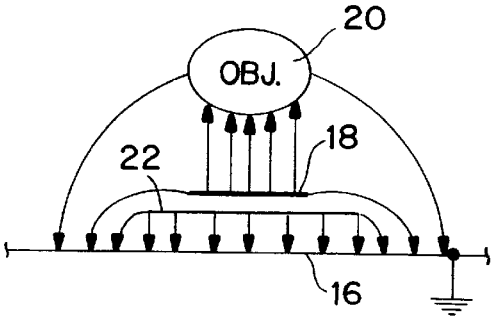
FIG. 2B is a diagram illustrating the electric field distribution of a proximity sensor in accordance with the present invention.
Figure 3:
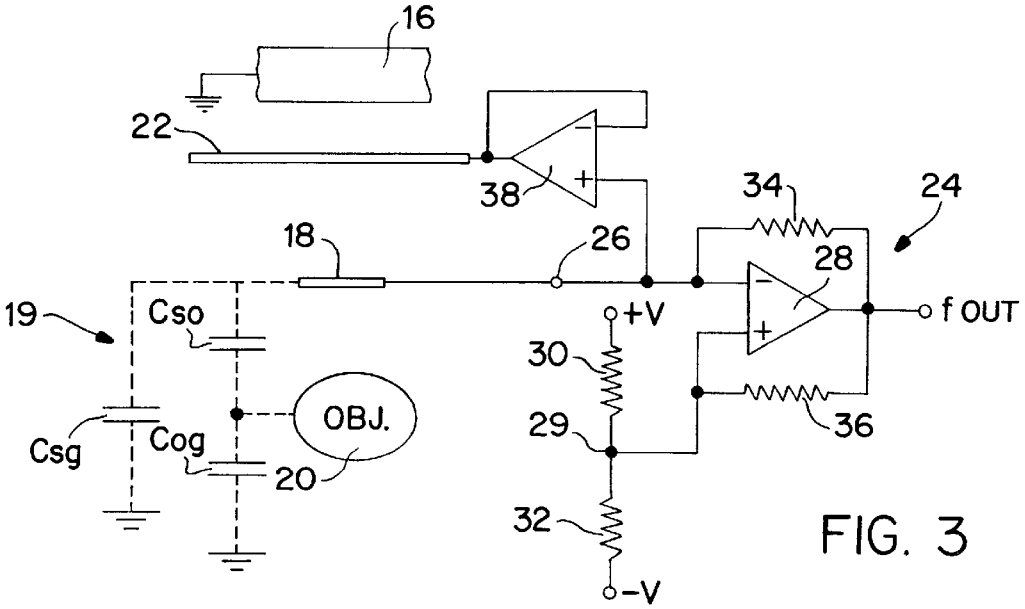
FIG. 3 is an electrical schematic diagram illustrative of the preferred embodiment of the invention wherein a driven shielding technique extends the range and sensitivity of a capacitive proximity sensor.

Referring now to FIG. 3, a relatively low frequency oscillator circuit operating at, for example, 20 kHz is coupled to a circuit node 26 to which the capacitive type proximity sensor 18 is connected for the configuration shown in FIG. 2B. The total capacitance 19 between the sensor 18 and the intruding object 20 is shown comprised of the capacitance $C_{sg}$ of the sensor 18 to ground, i.e. the arm 16, the series combination of the capacitance $C_{so}$ from the sensor 18 to the object 20 and the capacitance $C_{og}$ of the object 20 to ground. The composite of these three capacitances comprise a tuning capacitance for an oscillator 24 which is configured from an operational amplifier (op amp) 28, the sensor 18, a voltage divider comprised of two fixed resistors 30 and 32, and the series resistors 34 and 36 which act as feedback resistors between the output of the op amp 28 and negative (–) and positive (+) inputs, respectively. A voltage follower circuit comprised of an operational amplifier 38 couples the instantaneous voltage at the circuit node 26 to the shield 22.

Since a relatively low frequency is generated, a quasi-static case [obtains] *exists*. Assuming that a momentary positive potential exists at circuit node 26, it can be seen that electric field lines (FIG. 2B) emanating from the sensor 18 towards the object 20 induce negative charges on the object's surface nearest the sensor. Thus that surface can be considered one plate of a capacitor 19 and the sensor 18 the other. An ungrounded conductive object, on the other hand, is charged neutral so that an equal amount of positive charge will form on the surface away from the sensor so as to ensure that there is no net electric charge on the conductor. Accordingly, the tuning capacitance for the oscillator 24 at node 26 is:

$$(C_{so} \cdot C_{og}/(C_{so}+C_{og}))+C_{sg}=C_{19}. \quad (1)$$

Since the object 20 shown in FIG. 1 is grounded, and $C_{og}$ is therefore shorted, equation (1) reduces to:

$$C_{19}=C_{sg}+C_{so} \quad (2)$$

In examining equations (1) and (2), since detection of small changes in $C_{19}$ are desired, it becomes evident that the capacitance from the sensor to ground $C_{sg}$ must be relatively small. Therefore, the shield or reflector element 22 operates to force the field lines from the sensor 18 towards the object 20 as much as possible as shown in FIG. 2B.

Considering the case where the object 20 is not grounded, it is known that:

$$C=Q/V \quad (3)$$

It is also known that a good conductor must have the same potential everywhere on its surface. Therefore, the potential on the object 20 will be that of its farthest point from the sensor 18. If the potential on the sensor 18 is defined as V and the potential on the object as $V_0$, then the following relationships are obtained:

$$Q_i/V-V_0=C_{so} \text{ and} \quad (4)$$

$$Q_i/V_0=C_{og} \quad (5)$$

Where $Q_i$ is the charge induced on each side of the object. It is apparent that an object with any dimension more than a few inches in any direction forces the potential on the entire surface of the object to be very low and as experimental evidence indicates, all objects are substantially grounded.

Thus where a capacitive sensing element 18 is backed by a reflector 22 driven at the same voltage as and in phase with the sensor, the field lines will be reflected away from the grounded robot arm 16 towards the intruding object 20. This dramatically increases the range by a magnitude of at least 10, i.e. from 1 in. to 12 in., for example. Furthermore, with this technique, capacitive sensor(s) 18 can be mounted closer to grounded surfaces without any penalty in performance and modern circuit techniques employing flexible printed circuit boards can be utilized to great advantage.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

We claim:

1. A capacitive type proximity sensor having improved range and sensitivity between a machine and an intruding object in the immediate vicinity of the machine, comprising:

an outer electrical conductor on said machine forming one electrode of a sensor capacitor, [the] *an* other electrode comprising said *intruding* object, said outer *electrical* conductor comprising a first thin sheet of conductive material;

an intermediate electrical conductor located between said outer *electrical* conductor and said machine and being of a size substantially larger than said outer *electrical* conductor to act as a shield for reducing the parasitic capacitance between said outer *electrical* conductor and said machine, said intermediate *electrical* conductor comprising a second thin sheet of conductive material substantially wider than said [first] *outer electrical* conductor;

said outer and intermediate conductors attached to a surface on said machine [with no gap between the conductors] *wherein said conductors are spaced apart in substantially overlapping parallel fashion,* and no gap between said surface and said intermediate conductor and [said outer and intermediate conductors coplanar with each other] and said surface of said machine, said surface of said machine acting as a ground plane*, with said intermediate electrical conductor and said surface of said machine spaced apart in substantially overlapping parallel fashion*;

first circuit means for coupling in phase the instantaneous voltage at said outer electrical conductor to said intermediate electrical conductor;

second circuit means coupled to said outer *electrical* conductor and being responsive to the capacitance of said sensor capacitor for generating a control signal to said machine.

2. The sensor of claim 1 wherein said first circuit means comprises a voltage follower circuit comprised of an operational amplifier.

3. The sensor of claim 2 wherein said second circuit means comprises a signal generator having an output signal indicative of the capacitance of said sensor capacitor.

4. The sensor of claim 3 wherein said signal generator comprises a variable frequency oscillator.

5. The sensor of claim 1 wherein said machine comprises a robotic apparatus.

6. The sensor of claim 5 wherein said robotic apparatus comprises a movable member of said robotic apparatus.

7. The sensor of claim 6 wherein said movable member comprises an articulated member.

8. The sensor of claim 7 wherein said articulated member comprises a robotic arm.

* * * * *